United States Patent
Ye et al.

(10) Patent No.: US 11,054,751 B2
(45) Date of Patent: Jul. 6, 2021

(54) APPARATUS WITH A SENSOR AND A METHOD OF PERFORMING TARGET MEASUREMENT

(71) Applicant: ASML Holding N.V., Veldhoven (NL)

(72) Inventors: Hong Ye, Wilton, CT (US); Gerrit Johannes Nijmeijer, Stamford, CT (US)

(73) Assignee: ASML Holding N.V., Veldhoven (NL)

( * ) Notice: Subject to any disclaimer, the term of this patent is extended or adjusted under 35 U.S.C. 154(b) by 0 days.

(21) Appl. No.: 15/766,728

(22) PCT Filed: Sep. 30, 2016

(86) PCT No.: PCT/EP2016/073384
§ 371 (c)(1),
(2) Date: Apr. 6, 2018

(87) PCT Pub. No.: WO2017/063898
PCT Pub. Date: Apr. 20, 2017

(65) Prior Publication Data
US 2018/0299793 A1    Oct. 18, 2018

Related U.S. Application Data

(60) Provisional application No. 62/240,396, filed on Oct. 12, 2015.

(51) Int. Cl.
*G03F 7/00*   (2006.01)
*G03F 7/20*   (2006.01)
*G03F 9/00*   (2006.01)

(52) U.S. Cl.
CPC ...... *G03F 7/70633* (2013.01); *G03F 7/70775* (2013.01); *G03F 9/7076* (2013.01); *G03F 9/7088* (2013.01)

(58) Field of Classification Search
CPC .............. G03F 7/70633; G03F 9/7076; G03F 7/70775; G03F 9/7088
(Continued)

(56) References Cited

U.S. PATENT DOCUMENTS 6,737,658 B1   5/2004   Nakasugi et al.
6,961,116 B2   11/2005  Den Boef et al.
(Continued)

FOREIGN PATENT DOCUMENTS

CN   101673059   3/2010
CN   103885295   6/2014
(Continued)

OTHER PUBLICATIONS

International Search Report and Written Opinion dated Jan. 11, 2017 in corresponding International Patent Application No. PCT/EP2016/073384.
(Continued)

*Primary Examiner* — Michael Maskell
(74) *Attorney, Agent, or Firm* — Pillsbury Winthrop Shaw Pittman LLP

(57) ABSTRACT

A method and apparatus to measure a target (e.g., an alignment mark (e.g., on a substrate)) is disclosed. Relative movement between the target and a measurement spot of a measurement system in a "fly-in" direction (e.g., movement of the target towards the measurement spot) is performed so that a first measurement for the target can be made. Thereafter, relative movement between the target and the measurement spot is made in an opposite "fly-in" direction so that a second measurement for the target can be made. By combining (e.g., averaging) these two measurements, an error is cancelled out, and higher accuracy in the measurement may be achieved.

20 Claims, 8 Drawing Sheets

(58) Field of Classification Search
USPC .............. 250/396 R–400, 306, 307, 310, 311
See application file for complete search history.

(56) References Cited

U.S. PATENT DOCUMENTS

| | | | |
|---|---|---|---|
| 7,209,215 | B2 | 4/2007 | Akamatsu |
| 7,408,642 | B1 | 8/2008 | DiBiase |
| 8,208,121 | B2 | 6/2012 | Bijnen et al. |
| 8,264,671 | B2 | 9/2012 | Aarts et al. |
| 2001/0006216 | A1* | 7/2001 | Koike .................. H01J 37/3045 250/398 |
| 2003/0142313 | A1 | 7/2003 | Katayama |
| 2007/0019176 | A1 | 1/2007 | Akamatsu |
| 2009/0323037 | A1* | 12/2009 | Aarts .................. G03F 7/70516 355/67 |
| 2014/0022377 | A1 | 1/2014 | Kanaya |
| 2015/0234290 | A1 | 8/2015 | Mathijssen et al. |
| 2015/0285627 | A1* | 10/2015 | Yamaguchi ............. H01J 37/26 702/150 |

FOREIGN PATENT DOCUMENTS

| | | |
|---|---|---|
| JP | S59119204 | 7/1984 |
| JP | H0282510 | 3/1990 |
| JP | H0613286 | 1/1994 |
| JP | H0799148 | 4/1995 |
| JP | 2010034516 | 2/2010 |
| JP | 2015518654 | 7/2015 |

OTHER PUBLICATIONS

Japanese Office Action issued in corresponding Japanese Patent Application No. 2018-515793, dated May 31, 2019.
Chinese Office Action issued in corresponding Chinese Patent Application No. 201680059924.6, dated Aug. 16, 2019.

* cited by examiner

APPARATUS WITH A SENSOR AND A METHOD OF PERFORMING TARGET MEASUREMENT

CROSS-REFERENCE TO RELATED APPLICATIONS

This application is the U.S. national phase entry of PCT patent application no. PCT/EP2016/073384, which was filed on Sep. 30, 2016, which claims the benefit of priority of U.S. Provisional Patent Application No. 62/240,396, which was filed on Oct. 12, 2015, and which is incorporated herein in its entirety by reference.

FIELD

The present description relates to an apparatus with a sensor and a method of performing target measurement.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to control a patterning process (i.e., a process by which patterns are created on a substrate and involving a patterning step, such as optical lithography, imprint lithography, etc., and optionally involving other related processing such as resist application, resist development, substrate baking, etching, etc.) to provide device features accurately on the substrate, one or more metrology targets (e.g., overlay targets, alignment marks, etc.) are generally provided on, for example, the substrate. One or more sensors are provided, e.g., in the lithographic apparatus to measure the one or more targets to measure or derive a parameter of the patterning process, such as overlay, alignment, etc.

SUMMARY

Accordingly, it would be advantageous, for example, to provide more accurate measurements of a target, for example to control alignment and/or overlay error as product features get smaller and smaller.

According to an aspect, there is provided a method of measuring a target, the method comprising: performing a first relative movement in a first direction between the target and a measurement spot of a measurement apparatus; after the first relative movement, performing a second relative movement in a second direction between the measurement spot and the target at least partially while the measurement spot is on the target or to cause the measurement spot to become located on the target; during or after the second relative movement, performing a first measurement for the target using the measurement spot on the target; after the first measurement, performing a third relative movement in an essentially opposite direction to the first direction between the target and the measurement spot; after the third relative movement, performing a fourth relative movement in the second direction between the measurement spot and the target at least partially while the measurement spot is on the target or to cause the measurement spot to become located on the target; and during or after the fourth relative movement, performing a second measurement for the target using the measurement spot on the target.

According to an aspect, there is provided a method of measuring a target, the method comprising: performing a first relative movement between the target and a measurement spot of a measurement apparatus in a first direction and to a termination point; after the first relative movement, performing a second relative movement in a second direction between the measurement spot and the target at least partially while the measurement spot is on the target or to cause the measurement spot to become located on the target; during or after the second relative movement, performing a first measurement for the target using the measurement spot on the target; after the first measurement, performing a third relative movement between the target and the measurement spot in an essentially opposite direction to the first direction and to the termination point; after the third relative movement, performing a fourth relative movement in a third direction between the measurement spot and the target at least partially while the measurement spot is on the target or to cause the measurement spot to become located on the target; and during or after the fourth relative movement, performing a second measurement for the target using the measurement spot on the target.

According to an aspect, there is provided a method of measuring a target, the method comprising: performing a first relative movement at a non-zero angle to a first direction or a second direction, between the target and a measurement spot of a measurement apparatus; after the first relative movement, performing relative movement in the first direction between the measurement spot and the target at least partially while the measurement spot is on the target or to cause the measurement spot to become located on the target; during or after the first relative movement, performing a first measurement for the target using the measurement spot on the target; after the first measurement, performing a third relative movement at an angle essentially opposite to the non-zero angle between the target and the measurement spot; after the third relative movement, performing a fourth relative movement in the second direction between the measurement spot and the target at least partially while the measurement spot is on the target or to cause the measurement spot to become located on the target; and during or after the fourth relative movement, performing a second measurement for the target using the measurement spot on the target.

According to an aspect, there is provided an apparatus comprising: a substrate table; a measurement system configured to measure a target on the substrate table using a beam, the beam being directed towards a spot on the substrate table; and a control system configured to control the position of the substrate table relative to the measurement system, the control system configured to: move the substrate table to cause a first relative movement in a first direction between the target and the spot, after the first relative movement, perform a second relative movement in a second direction between the spot and the target at least partially while the spot is on the target or to cause the spot to become located on the target, during or after the second relative movement, perform a first measurement for the target using the spot on the target, after the first measurement, move the substrate table to perform a third relative movement in an essentially opposite direction to the first direction between the target and the spot, after the third relative movement, perform a fourth relative movement in the second direction between the spot and the target at least partially while the spot is on the target or to cause the spot to become located onto the target, and during or after the fourth relative movement, perform a second measurement for the target using the spot on the target.

According to an aspect, there is provided an apparatus comprising: a substrate table; a measurement system configured to measure a position of the target on the substrate table using a beam, the beam being directed towards a spot on the substrate table; and a control system configured to control the relative position between the substrate table and the beam, the control system configured to: move the substrate table to cause a first relative movement between the target and the spot in a first direction and to a termination point, after the first relative movement, perform a second relative movement in a second direction between the spot and the target at least partially while the spot is on the target or to cause the spot to become located on the target, during or after the second relative movement, perform a first measurement for the target using the spot on the target, after the first measurement, move the substrate table to cause a third relative movement between the target and the spot in an essentially opposite direction to the first direction and to the termination point, after the third relative movement, perform a fourth relative movement in a third direction between the spot and the target at least partially while the spot is on the target or to cause the spot to become located on the target, and during or after the fourth relative movement, perform a second measurement for the target using the spot on the target.

According to an aspect, there is provided an apparatus comprising: a substrate table; a measurement system configured to measure a target on the substrate table using a beam, the beam being directed towards a spot on the substrate table; and a control system configured to control the position of the substrate table relative to the beam, the control system configured to: move the substrate table to cause a first relative movement at a non-zero angle to a first direction or a second direction, between the target and the spot, after the first relative movement, perform relative movement in the first direction between the spot and the target at least partially while the spot is on the target or to cause the spot to become located on the target, during or after the first relative movement, perform a first measurement for the target using the spot on the target, after the first measurement, move the substrate table to cause a third relative movement at an angle essentially opposite to the non-zero angle between the target and the spot, after the third relative movement, perform a fourth relative movement in the second direction between the spot and the target at least partially while the spot is on the target or to cause the spot to become located on the target, and during or after the fourth relative movement, perform a second measurement for the target using the spot on the target.

BRIEF DESCRIPTION OF THE DRAWINGS

Embodiments will now be described, by way of example only, with reference to the accompanying schematic drawings in which corresponding reference symbols indicate corresponding parts, and in which.

DETAILED DESCRIPTION

Figure 1:
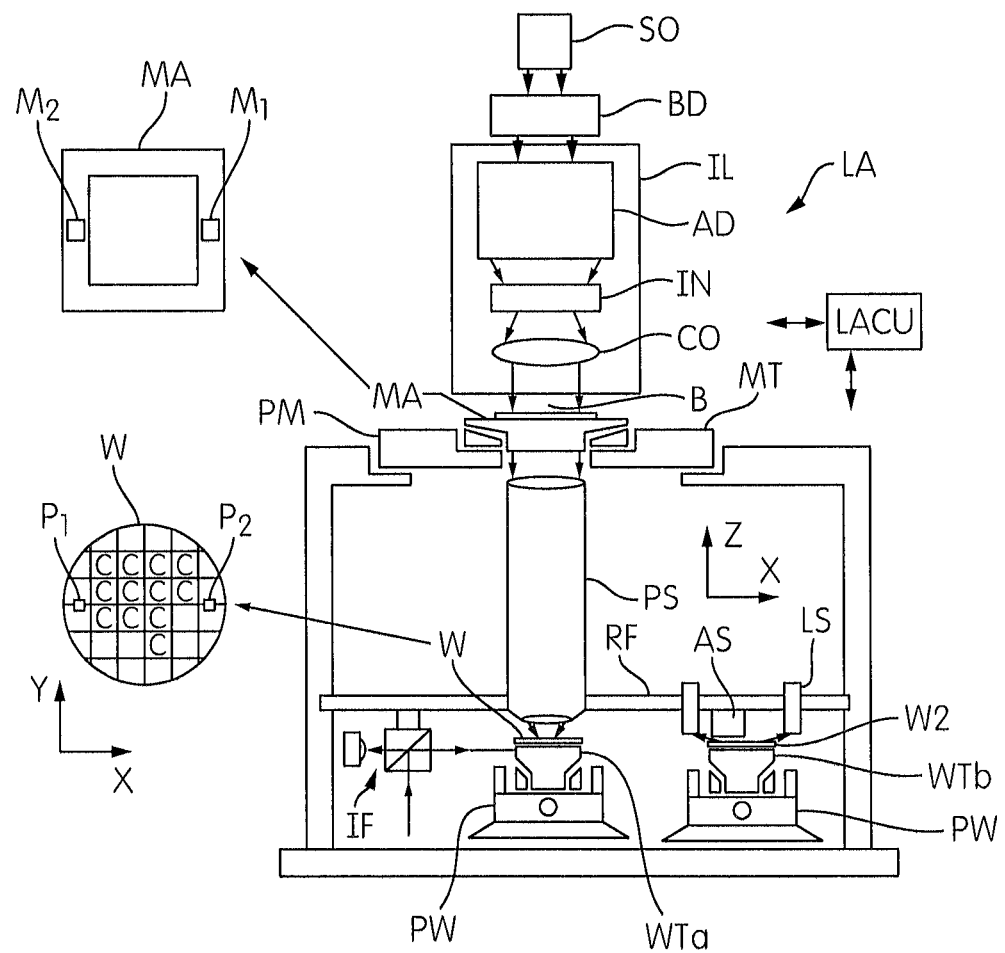
FIG. 1 schematically depicts a lithographic apparatus according to an embodiment.

FIG. 1 schematically depicts an embodiment of a lithographic apparatus LA. The apparatus comprises:

an illumination system (illuminator) IL configured to condition a radiation beam B (e.g. UV radiation or DUV radiation);

a support structure (e.g. a mask table) MT constructed to hold a patterning device (e.g. a mask) MA and connected to a first positioner PM configured to accurately position the patterning device in accordance with certain parameters;

a substrate table (e.g. a wafer table) WTa constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more support structures). In such "multiple stage" machines the additional tables/support structure may be used in parallel, or preparatory steps may be carried out on one or more tables/support structure while one or more other tables/support structures are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WTa may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WTa are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WTa are scanned synchronously while a pattern imparted to the radiation beam is projected onto a target portion C (i.e. a single dynamic exposure). The speed and direction of the substrate table WTa relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WTa is moved or scanned while a pattern imparted to the radiation beam is projected onto a target portion C. In this mode, generally a pulsed radiation source is employed and the programmable patterning device is updated as required after each movement of the substrate table WTa or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA may be a so-called multi-stage type apparatus which has at least two tables WTa and WTb and at least two stations—e.g., an exposure station and a measurement station—between which the tables can be exchanged, as shown in FIG. 1. For example, where there at least two substrate tables WTa and WTb, while one substrate on one substrate table is being exposed at the exposure station, another substrate is provided at the other substrate table (e.g., loaded onto the other substrate table) at the measurement station so that various preparatory steps may be carried out. The preparatory steps may include mapping the surface of the substrate using a level sensor LS and/or measuring the position of one or more alignment marks on the substrate using a measurement system, such as an alignment sensor AS. This can enable a substantial increase in the throughput of the apparatus. Where at least one table is a substrate table and at least one other table is a measurement table, while the substrate on one substrate table is being unloaded or otherwise processed, the measurement table may be used at the exposure location to, e.g., measure the projection system. Or, when the substrate on the substrate table is being exposed at the exposure location, the measurement table may be used for one or more processing steps. If the position sensor IF is not capable of measuring the position of the substrate table while it is at the measurement station as well as at the exposure station, a second position sensor may be provided to enable the positions of the substrate table to be tracked at both stations.

The apparatus LA includes a lithographic apparatus control unit LACU which controls movements and measurements of various actuators and sensors described herein. The control unit LACU includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus. For example, one processing subsystem may be dedicated to servo control of the substrate positioner PW. Separate units may even handle coarse and fine actuators, or different axes. Another unit might be dedicated to the readout of the position sensor IF. Overall control of the apparatus may be controlled by a central processing unit, communicating with these sub-systems processing units, with operators and with other apparatuses involved in the lithographic manufacturing process.

In some known methods or techniques, when using a sensor(s), a relative movement is performed between one or more targets (i.e., a structure designed or selected for measuring a parameter, such a grating, one or more particular device pattern features, a cross or box structure, etc.) and a measurement spot of the sensor(s) (e.g., a substrate with a plurality of targets is moved relative to a measurement beam spot such that the measurement beam spot is located over each of the plurality of targets) so that the sensor(s) can measure the one or more target(s) (e.g., where the target is an alignment mark, measure a position to obtain alignment information). Typically, such methods include performing only one measurement for each target. During such measurements, there are multiple sources that can bring in error into the measurement, including error driven by the relative movement acceleration (e.g., substrate acceleration (including substrate deceleration)). Observation indicates that the amplitude of the error increases with the acceleration (e.g., deceleration) and the polarity depends on the "fly-in" direction, i.e., the direction at which the relative movement takes place to have the measurement spot arrive to on or near the target. To reduce the error within a measurement, two methods have been used: one is to reduce the acceleration (e.g., deceleration) of the target and the other is to increase the settle time of the target. Both are used to reduce the amplitude of the error. But, these methods may be undesirable, however, since they may increase the time for measurement and reduce the measurement apparatus throughput. Also, not all errors are reduced by simply decreasing the acceleration/speed and/or increasing settle time.

For the purpose of the present description, an embodiment will be described with respect to a measurement apparatus in the form of an alignment measurement apparatus; but, as discussed below, the present description is not limited to an alignment measurement apparatus. An alignment measurement apparatus effectively determines a position of an object to enable determination of whether the object aligns with another object. In an embodiment, the alignment measurement apparatus is provided to a lithographic apparatus to enable determination of alignment between a substrate onto which patterns are to be provided and one or more other objects (such as a patterning device). However, the alignment measurement apparatus may be stand-alone or provided to an apparatus other than a lithographic apparatus (e.g., provided to a metrology system to measure substrates coming from the lithographic apparatus, where such metrology system may be used to determine a parameter (e.g., overlay, critical dimension (CD), focus, dose, etc.) of the patterning process).

As alluded to above, the present description is not limited to an alignment measurement apparatus. Rather, embodiments described herein may be applied to other measurement apparatus. For example, in an embodiment, the embodiments described herein are employed in a metrology system to measure substrates coming from the lithographic apparatus, where such metrology system may be used to determine a parameter (e.g., overlay, critical dimension (CD), focus, dose, etc.) of the patterning process.

Continuing with the non-limiting alignment measurement apparatus embodiment, one or more alignment targets (which also may be referred to as an alignment mark) are generally provided on a table (e.g., on the substrate table WTb, whether on the substrate and/or on the substrate table WTb itself, or on the patterning device support MT, whether on the patterning device MA and/or on the patterning device support MT itself), and an apparatus, e.g., a lithographic apparatus, includes one or more alignment sensors—represented by, for example, sensor AS in FIG. 1—by which positions of the targets are accurately measured. The alignment sensor is effectively a position measurement apparatus or system configured to measure a position of the target. In an embodiment, the alignment sensor AS is configured to provide measurement radiation (e.g., an electromagnetic radiation beam) from a source (e.g., illumination source) onto the target (e.g., an alignment grating), detect diffracted or reflected measurement radiation from the target using a detector, and analyze the detected radiation (e.g. via a processing unit PU (see FIG. 3) and/or controller) to determine a measurement of the target. Alignment may be adjusted using the controller and/or other devices based on the analysis of the detected radiation.

A measurement apparatus (e.g., the alignment sensor AS) makes a measurement at a spot or position (see, e.g., spot 205 of FIG. 2 and the location where beam 222 of FIG. 3 impacts an underlying surface, further described below) on an underlying surface (e.g., the substrate and/or substrate table). This measurement spot is used in the detection of the target to determine, e.g., a position measurement (e.g., X and/or Y coordinates) corresponding to the target. In an embodiment, measurement radiation (e.g., electromagnetic radiation) output by the measurement apparatus is directed towards the measurement spot.

The measurement spot may be used to determine measurements by recording an image of the target, or scanning the target, or a combination thereof. Any number of methods for determining the measurements may be used. For example, in an embodiment, the target and the measurement spot are moved relative to one another to make a measurement. In an embodiment, the target is moved relative to the measurement spot, while the measurement spot is essentially static. In an embodiment, scanning of the measurement apparatus, a component of the measurement apparatus, or a measurement beam itself is used to cause the measurement spot to be moved while the target is essentially static. In an embodiment, both the target and the measurement spot are relatively moved.

A relative movement between the measurement spot and the target as described herein is performed at least partially while the measurement spot is on the target, or to cause the measurement spot to be located onto the target (e.g., to then perform relative movement between the measurement spot and the target to take a measurement; or to record an image when the measurement spot is on the target). The measurement is taken when the measurement spot is on the target and determination of a parameter of the patterning process uses information and/or data obtained from the measurement when the spot is on the target.

Figure 2:
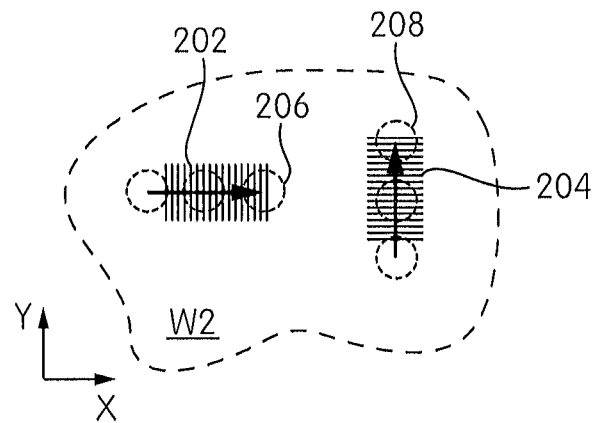
FIG. 2 schematically depicts examples of targets that are detected on, for example, a substrate according to an embodiment.

FIG. 2 shows examples of targets 202, 204, provided on, e.g., substrate W2, for the measurement of, e.g., X position, overlay, etc. and Y position, overlay, etc., respectively. In an embodiment, each target in this example comprises a series of bars formed in a product layer or other layer applied to or etched into a surface, such as the substrate. The bars in each target as shown in FIG. 2 are regularly spaced and act as grating lines so that the target can be regarded as a diffraction grating with a known spatial period (pitch). However, this depiction is not intended to be limiting as, for example, the target need not operate on diffraction principles, and the target may include, for example, irregularly spaced bars, a symmetrical configuration of bars (e.g., V-shape), a box, a cross, etc. In an embodiment, the bars may be parallel to one axis to provide periodicity in the other axis. For example, bars of a target 202 may be parallel to the Y-axis to provide periodicity in the X-direction.

The measurement apparatus (e.g., alignment sensor AS (shown in FIG. 1) measures each target on the substrate W2 optically, e.g., with a spot 206, 208 of radiation (the measurement beam). In an embodiment, there is provided relative movement between the spot 206, 208 (e.g., the relative movement is indicated schematically by a broad arrow in FIG. 2 with progressive positions of the spot 206 or 208 indicated in dotted outline) and the applicable target such that the measurement apparatus obtains a periodically-varying signal, such as a sine wave. In an embodiment, the target comprises overlying periodic structures so that a diffraction signal is produced which has an asymmetry as a function of the lateral displacement between the overlying structures. The signal is analyzed (e.g., the phase of the periodically varying signal and/or the intensity asymmetry of diffraction orders of the diffraction signal) to measure a parameter of the patterning process (e.g., the position of the target for the periodically-varying signal or overlay for the diffraction signal), and hence of substrate W2. In an embodiment, for the periodically-varying signal, the position of the target is determined relative to the alignment sensor, which may in turn be fixed relative to a reference frame RF of the apparatus.

For alignment targets, coarse and fine targets may be provided, so that the alignment sensor can distinguish between different cycles of the periodic signal, as well as the exact position (phase) within a cycle. Alignment targets of different pitches can also be used for this purpose. Also, an alignment target may be tilted or provided at an angle (such as described in U.S. Pat. No. 8,208,121, which is hereby incorporated by reference in its entirety).

The design and operation of various measurement apparatuses, e.g., an alignment sensor, is known in the art. An alignment sensor is effectively a position measurement apparatus; a type of alignment sensor used is based on a self-referencing interferometer as described in U.S. Pat. No. 6,961,116, which is incorporated herein in its entirety by reference. Targets may be measured separately to obtain X position, overlay, etc. and Y position, overlay, etc. position. However, a combined X- and Y-measurement can be performed using a technique described in U.S. Pat. No. 8,208, 121, which is incorporated herein in its entirety by reference. For the purpose of the present description, as noted above, a non-limiting embodiment will be described with respect to a measurement apparatus in the form of an alignment sensor AS as shown in FIG. 3.

Figure 3:
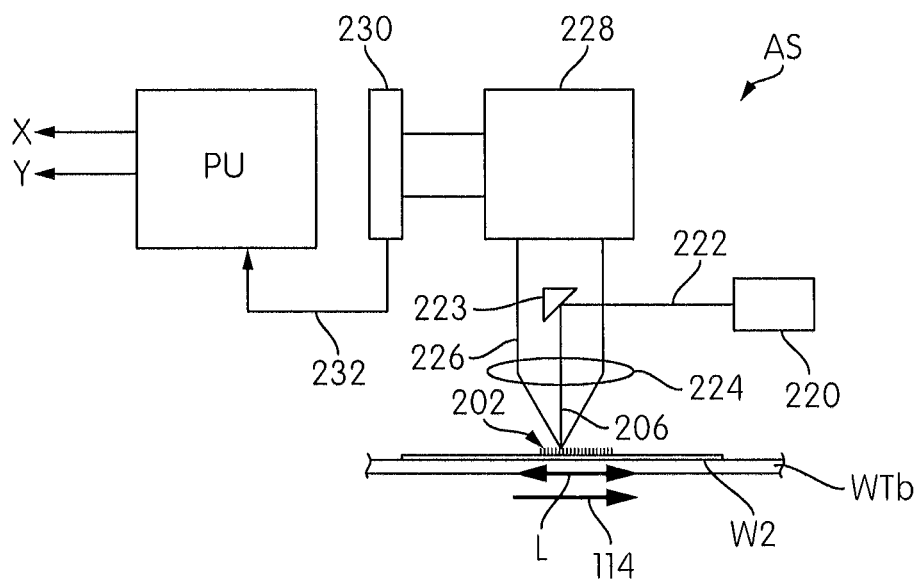
FIG. 3 is a schematic block diagram of a measurement apparatus, in this example in the form of an alignment sensor, configured to measure a target, such as the targets of FIG. 2.

FIG. 3 is a schematic block diagram of a measurement apparatus in the form of an alignment sensor AS. Illumination input 220 provides a beam 222 of radiation of one or more wavelengths. In an embodiment, the illumination input 220 may be a source of the radiation (e.g., a laser) or an inlet connected, in use, to a source of the radiation. The radiation from the illumination input is diverted by a deflection device 223 onto a target, such as target 202, located on, e.g., substrate W2. The target 202 is shown for illustrative purposes only, and not intended to be limiting with regards to its configuration. In an embodiment, the deflection device 223 is a spot mirror, and the beam 222 of radiation is diverted by the mirror through an objective lens 224 and onto the target 202. In an embodiment, the deflection device 223 is a prism (and objective lens need not be provided).

Radiation reflected or scattered by target 202 is picked up by objective lens 224 (or passes through a prism) and is collimated into an information-carrying beam 226 that is collected by an interferometer 228. This information-carrying beam 226 is used to, for example, measure the location of the target 202 with respect to a reference point. This reference point can be a grating or the "neutral line" in an interferometer 228 that is self-referencing. The interferometer 228 processes beam 226 and outputs separate beams onto a detector 230 which may be in the form of a sensor array. In an embodiment, the system to process the information-carry beam 226 may be different than the interferometer 228 and detector 230.

One or more signals 232 from the detector 230 (e.g., from individual sensors in a sensor grid) are provided to a processing unit PU or a signal analyzer. By a combination of the optical processing in the interferometer 228 and the computational processing in the unit PU, values for X- and/or Y-position of the target 202 on the substrate relative to the reference frame RF are output. Alternatively, detector 230 may be a single photodiode, and the grating has the same pitch as the image that is imaged onto it. The amount of radiation transmitted by the grating varies as the alignment grating is scanned in the X-direction, for example.

Processing unit PU may be separate from the control unit LACU shown in FIG. 1, or they may share the same processing hardware, as a matter of design choice and convenience. Where unit PU is separate, part of the signal processing may be performed in the unit PU and another part in unit LACU.

The processing unit PU may be coupled to the substrate table WTb or its position sensor IF such that the position of the substrate table WTb is known when the center of target 202 is determined. Therefore, the position of the target 202 is very accurately known with reference to the substrate table WTb. Alternatively, the location of the alignment sensor AS may be known such that the center of the target 202 is known with reference to the alignment sensor AS. Accordingly, the exact location of the center of the alignment target is known relative to a reference position.

As mentioned previously, typical measurement methods include taking a single measurement of each target. Depending on the entry to the target and optionally relative movement between the measurement spot and target during measurement, there may be an error in measurements obtained from the target.

There have been different attempts to improve the measurement accuracy and reduce such error. Although in some cases these efforts can help reduce the amplitude of the error, these attempts seem to still result, however, in limited measurement accuracy and (in some cases) limited measurement speed. Also as a result, the system throughput may be reduced, e.g., due to reduced acceleration speed and increased settle time.

It has been observed that when there is relative movement between the target and the measurement spot (e.g., movement of the substrate relative to the measurement spot) in a first "fly-in" direction with a certain speed/acceleration profile to bring the measurement spot near to or upon the target, the measurement error produced is equal or substantially equal (in amplitude) to the measurement error produced by relative movement (e.g., movement of the substrate relative to the measurement spot) from an opposite direction in a second "fly-in" direction, or a direction (angle) that is essentially opposite or nearly opposite to the first "fly-in" direction, with a substantially identical speed/acceleration amplitude profile as the relative movement in the first "fly-in" direction. However, the sign of the error will be in reverse for these two opposite "fly-in" directions (i.e., one is positive and the other is negative).

By combining (e.g., averaging) the two measurements for a single target, where each measurement is obtained from (essentially) opposite "fly-in" directions (correspondingly opposite directions) in the same plane, one can cancel out most of the measurement error and achieve significantly higher accuracy in the measurement for the target. Since this property does not rely on a slower relative motion speed, the relative motion (e.g., substrate/stage motion) can be operated at higher speed to increase throughput. Also, since measurement is more accurate, fewer targets may be required and throughput may be increased. Accordingly, by measuring a target twice from different, opposite directions as disclosed in the methods described herein, a more accurate measurement of the target is obtained. Generally, such a process is illustrated in FIG. 4.

Figure 4:
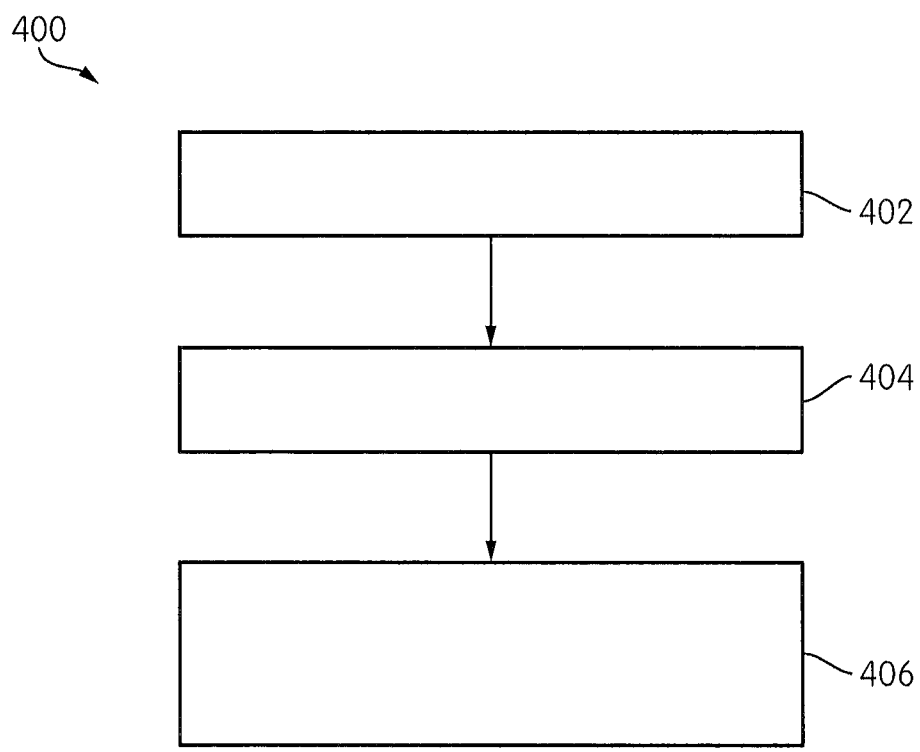
FIG. 4 is a flow chart diagram of a method to measure one or more targets in accordance with an embodiment.

FIG. 4 shows a method 400 of measuring one or more targets on, e.g., a substrate table WTb. A first measurement of one or more targets is taken at 402, then at least a second measurement of the same one or more targets is taken at 404. A parameter of the patterning process (e.g., position, alignment, overlay, etc.) is calculated at 406. In an embodiment, a parameter of the patterning process is calculated by averaging a value of the parameter for the first measurement and a value of the parameter for the at least second measurement and/or the parameter of the patterning process is determined from a calculated average of the first measurement and the at least second measurement. For example, when measuring multiple targets, first and second measurements are determined for each target. Then a value of a parameter of the patterning process (e.g., position, overlay, etc.) for each target is calculated based on the first and second measurements. Thus, multiple values of the parameter may be calculated (i.e., one for each target) and used to determine a value of the parameter of, e.g., the substrate W2. Exemplary embodiments using multiple targets for measurement are further described below.

Throughout this disclosure, a "first measurement" is defined as a first detection (e.g., via scanning, recording, or imaging) of a target using the measurement apparatus (e.g., a detection of X and/or Y coordinates of a target using an alignment beam of an alignment sensor AS). A "second measurement" is defined as a second detection (e.g., via scanning, recording, or imaging) of the same target using the measurement apparatus (e.g., a detection of X and/or Y coordinates of a target using an alignment beam of an alignment sensor AS). A parameter of the patterning process is determined based on a combination of these two measurements (e.g., the position of a target is determined based on a combination of two position measurements).

Referring to the measurement process in more detail, in an embodiment, the substrate W2 is placed on a substrate table WT2, such as shown in FIG. 3. The substrate table WTb is configured for movement to move the target(s) and the alignment sensor AS is configured to detect the target(s) thereon. In accordance with a non-limiting scanning embodiment, the substrate table WTb may be moved in the direction indicated by arrow 114 in FIG. 3 at a detection speed with which spot 206 traverses the length L of target 202. The substrate is controlled in this movement by its mounting on the substrate table WTb and the substrate positioning system PW. In an embodiment, the alignment sensor AS and spot 206 remain stationary, while the substrate W2 moves at a velocity with the table WTb. The alignment sensor AS can be mounted rigidly and accurately to the reference frame RF (shown in FIG. 1), while effectively detecting (e.g, scanning or capturing an image of) the target 202.

However, as previously noted, in an embodiment, the measurement spot 206 moves (e.g., across the target 202), while the target 202 (e.g., the substrate and/or substrate table) remains stationary or static. In an embodiment, both the spot 206 and the target 202 move.

Figure 5:
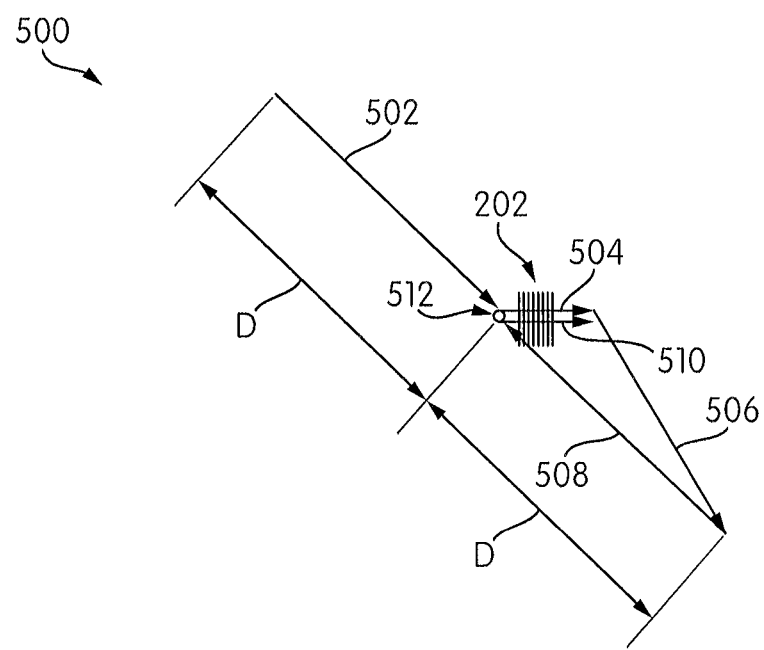
FIG. 5 is a schematic diagram of a method to measure one or more targets in accordance with an embodiment.

The method 400 as illustrated in FIG. 4 generally describes a two-step measurement taken for a target. In accordance with an embodiment, a method 500 of measuring one or more targets is shown in FIG. 5. In an embodiment, the target 202 as schematically shown in FIG. 5 is provided on a substrate W2 on substrate table WTb, but may be located elsewhere. Referring back to the method 500, arrow 502 represents a first direction for relative movement (or first "fly-in" of) between the target and a measurement spot of the measurement apparatus (e.g., relative movement of the measurement spot of the measurement apparatus toward the target). In an embodiment, the relative movement in the first direction, or first "fly-in" direction, is in any direction within the X-Y plane in which the measurement spot of the measurement apparatus is located. In an embodiment, the relative movement in the first direction, or first "fly-in" direction, is at a non-zero angle relative to a longitudinal or latitudinal axis of the target or relative to a direction of relative movement between the measurement spot and the target while the measurement spot is on the target for measurement, or relative to a direction of relative movement between the measurement spot and the target to cause the measurement spot to become located onto the target for measurement.

In an embodiment, the relative movement (e.g., caused by movement of the substrate table) in the first direction of the measurement spot with respect to the target, as represented by arrow 502, is to a termination point 512. That is, in an embodiment, the termination point 512 is a point near the target 202 that is aligned with the measurement spot of the measurement apparatus before the first measurement of the target 202 with the measurement spot on the target 202. A clear or specific termination point, like point 512, need not be provided or used.

In an embodiment, the "fly-in" motion to bring the measurement spot onto or near the target is substantially straight. In an embodiment, the "fly-in" motion is not limited to being in a straight line. Rather, a fluid or gradual change in direction and speed of from the "fly-in" directions may be performed. Accordingly, the illustrated termination point 512 and linear movement as depicted in the Figures is exemplary, and not intended to be limiting.

For explanation purposes only, the measurement of the target as described below (i.e., for the first measurement and a second measurement) may be described as involving scanning the target in a scanning direction, and causing relative movement between the measurement spot and the target from the termination point 512 such that the measurement spot is located over the target and there is relative movement between the measurement spot and the target while the measurement spot is located on the target. However, it should be understood that use of these terms with reference to the Figures is not intended that all embodiment are limited to scanning. Rather, the measurements of the target(s) as described herein may include any number of methods and devices, including, but not limited to, capturing an image (e.g., using a camera, or recording an image) of a target, as previously noted, by relative movement between the measurement spot and the target so that the measurement spot becomes located on the target (and thereafter the measurement may be taken while there is, or there is not, relative motion between the measurement spot and the target). In any of these cases, relative movement between the measurement beam spot 206 and the target 202 (at least partially) while the spot 206 is on the target 202, or the relative movement causing the spot 206 to become located onto the target 202, is performed, either via movement of the substrate table, movement of the measurement spot, or both. Further, the measurement of the target 202 is obtained by using information or data (e.g. diffracted or reflected radiation to the detector) collected (e.g., via scanning, recording, or capturing an image of) when the spot 206 is on the target 202.

As schematically shown in FIG. 5, after the "fly-in" movement in direction 502 to the termination point 512, a first measurement for the target 202 is detected. To enable the measurement, there is effectively a relative movement of the measurement spot with respect to the target in the direction noted by arrow 504 while the measurement spot is on the target for measurement, or there is effectively a relative movement of the measurement spot with respect to the target in the direction noted by arrow 504 to cause the measurement spot to become located onto the target for measurement. In FIG. 5, for example, the target 202 is scanned by the beam from alignment sensor AS in the positive X-direction 504 by moving the substrate in the negative X-direction. The direction 504 of relative movement (in an embodiment, from termination point 512) is different than the "fly-in" direction noted by arrow 502. In an embodiment, the direction 504 is performed in any direction within the X-Y plane.

Once measurement is complete, in an embodiment, there is relative movement of the measurement spot with respect to the target (e.g., moving the substrate table) in a direction as represented by arrow 506, to a position such that there can be a relative movement between the measurement spot and the target in an opposite "fly-in" direction to the first direction 502. Arrow 508 represents the direction that is opposite to the first direction (502) for a relative movement between the measurement spot and the target (or second "fly-in") from such a position. In an embodiment, the relative movement in this second "fly-in" direction is (essentially) opposite to the first "fly-in" direction at the non-zero angle. In an embodiment, the relative movement in the opposite "fly-in" direction, as represented by arrow 508, is to or near the termination point 512, before a second measurement for the target 202 is made. The "fly-in" movement does not have to be exactly to the same termination point 512, and may, instead, be substantially near the termination point 512 before a second measurement. So, for example, the second "fly-in" movement may cause the measurement spot to be located at a termination point 512 on the target, at which point measurement may be taken while there is, or there is not, relative movement between the measurement spot and the target. As another example, the second "fly-in" movement may cause the measurement spot to be located at a termination point 512 off the target, at which point measurement may be taken while there is relative movement of the measurement spot with respect to the target to cause the measurement spot to become located on the target and have relative movement between the measurement spot and the target while the measurement spot is on the target or measurement may be taken after there is relative movement of the measurement spot with respect to the target from the termination point 512 to cause the measurement spot to become located on the target.

Thus, after relative movement, e.g., to or near the termination point 512, from the opposite "fly-in" direction, a second measurement for the target 202 is detected. From the termination point 512, relative movement occurs in the same direction noted by arrow 504, e.g., the positive X-direction, as shown by arrow 510. For example, the substrate table may be moved in a negative X-direction (i.e., opposite to the arrow 510) for scanning of the target 202 by the beam from a measurement apparatus. Again, the direction noted by arrow 510 is different than the second "fly-in" direction noted by arrow 508. In an embodiment, the direction 510 is performed in any direction within the X-Y plane.

Thereafter, the first and second measurements are combined (as described above in respect of FIG. 4) to determine a parameter of the patterning process.

In an embodiment, in the first "fly-in", the relative motion is a distance D towards the termination point 512 in the first direction, as shown in FIG. 5. In the second "fly-in", the relative motion is the substantially same distance D towards the termination point 512 (which may be near to or be the same position at the termination point 512 for the first "fly-in") in the opposite direction to the first direction. In an embodiment, having the first and second "fly-in" motion having the substantially the same distance D (for both directions) provides a more accurate measurement of the target, since the errors from the combination of the measurements are more likely to overlap (and cancel each other out).

Figure 6:
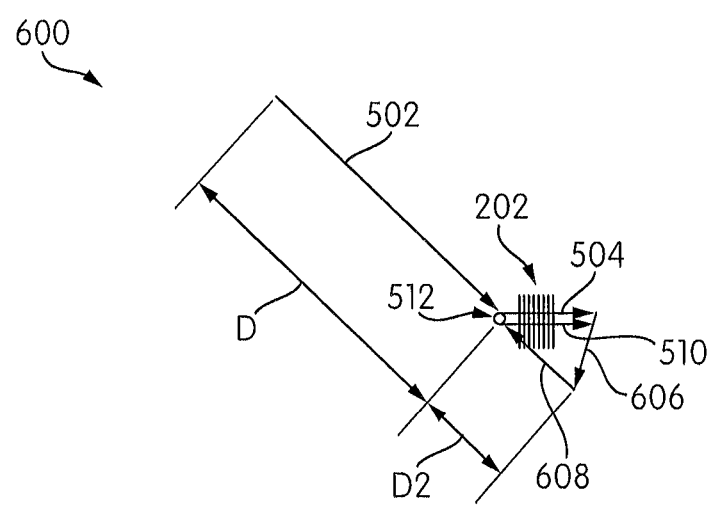
FIG. 6 is a schematic diagram of a method to measure one or more targets in accordance with an embodiment.

In an embodiment, as schematically depicted in FIG. 6, during the second "fly-in" motion, the distance D2 of the second "fly-in" motion in the opposite direction to the first "fly-in" motion, as represented by arrow 608, towards the termination point 512 is different than the distance D for the first "fly-in" motion in the first direction represented by arrow 502. More specifically, FIG. 6 shows a method 600 of measuring a position of one or more targets 202, wherein there is relative motion between of the measurement spot with respect to target stage by a distance D in a first direction noted by arrow 502 towards termination point 512. The target 202 is detected after and/or using relative movement of the measurement beam spot with respect to the target in a direction noted by arrow 504 (e.g., via scanning). After measurement, there is relative movement of the measurement spot with respect to the target, as represented by arrow 606, to a position such that the target 202 can be moved towards the termination point 512 in an opposite "fly-in" direction to the first direction. Arrow 608 represents the direction that is opposite to the first direction 502. Further, the second "fly-in" motion in the opposite direction 608 is for a distance D2 to the termination point 512, where distance D2 is different than distance D (in this example, distance D2 is less than distance D). Having one "fly-in" motion have a different distance than another "fly-in" motion enable faster measurement of the target. For example, in an embodiment, the distance D is greater than the distance D2. Accordingly, the time to cause the relative movement of distance D2 is shorter (as compared to the time for the relative movement of distance D), and thus the detection of the target (e.g., via scanning in direction 510) is performed relatively quicker. In an embodiment, the distance D for the first "fly-in" motion is less than the distance D2 for the second "fly-in" motion. Thereafter, the first and second measurements are combined (as described above in respect of FIG. 4) to determine a parameter of the patterning process.

In an embodiment, a distance for the first "fly-in" motion at the non-zero angle is the same as a distance for the second "fly-in" motion at the opposite angle. In an embodiment, a distance for the first "fly-in" motion at the non-zero angle is different than a distance for the second "fly-in" motion at the opposite angle.

When measuring multiple targets, the apparatus performs in such a manner so as to perform the first "fly-in" motion in the first direction, perform the first measurement for each target of the plurality of targets, perform second "fly-in" motion in the opposite direction to the first direction and perform the second measurement for each target of the plurality of targets, in accordance with an embodiment.

Figure 7A:
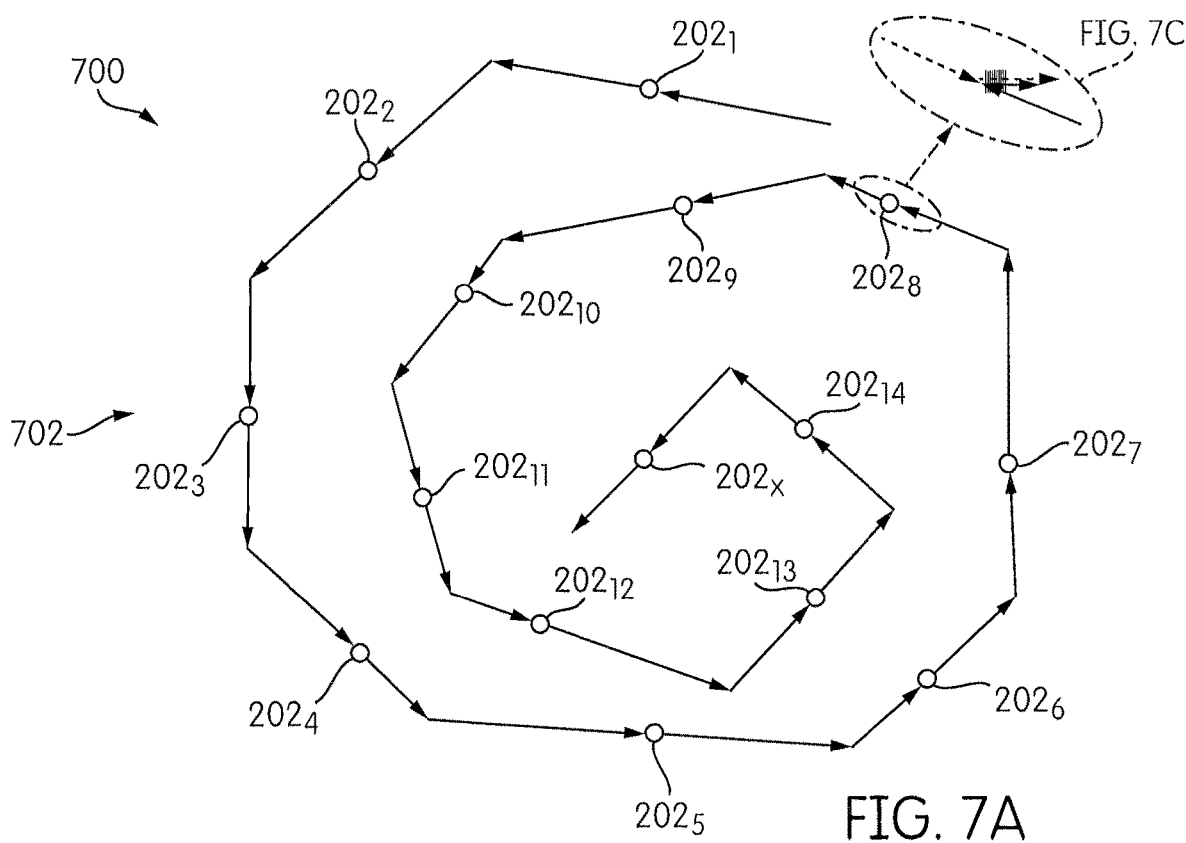
FIGS. 7A, 7B, 7C, 7D and 7E are schematic diagrams illustrating exemplary methods to measure a plurality of targets, in accordance with an embodiment.
Figure 7B:
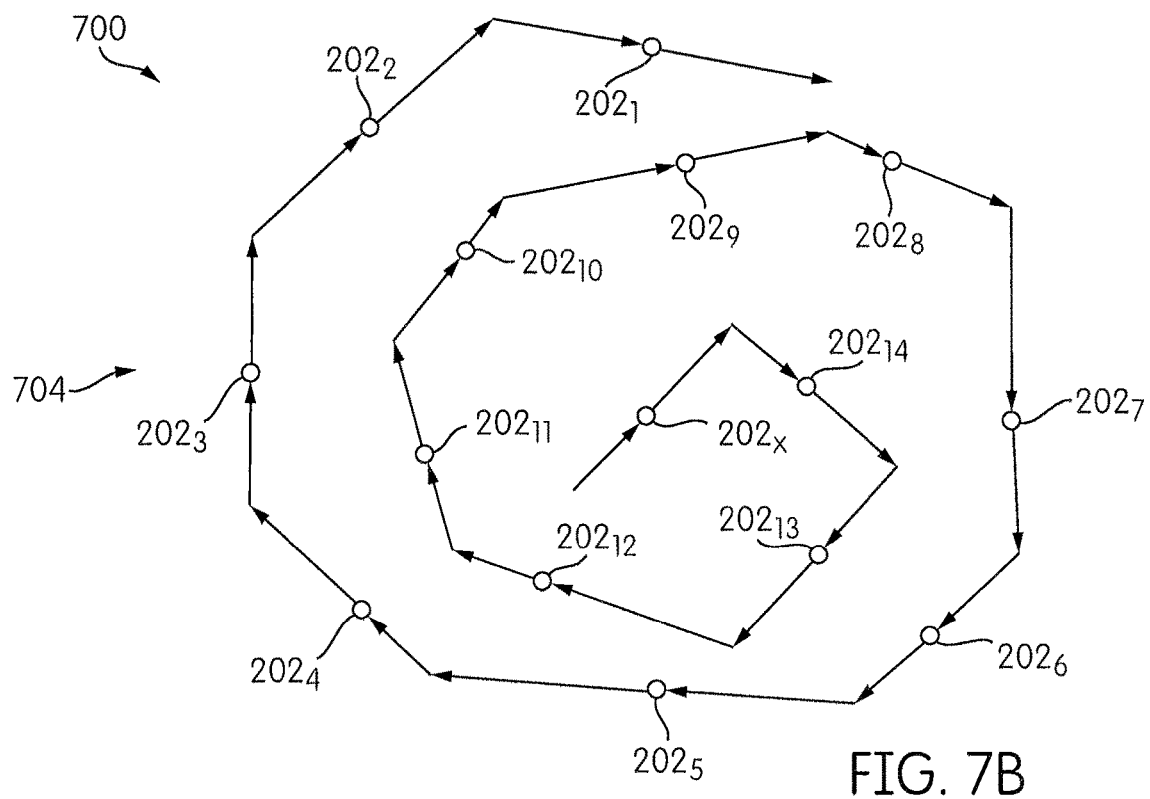
Figure 7C:
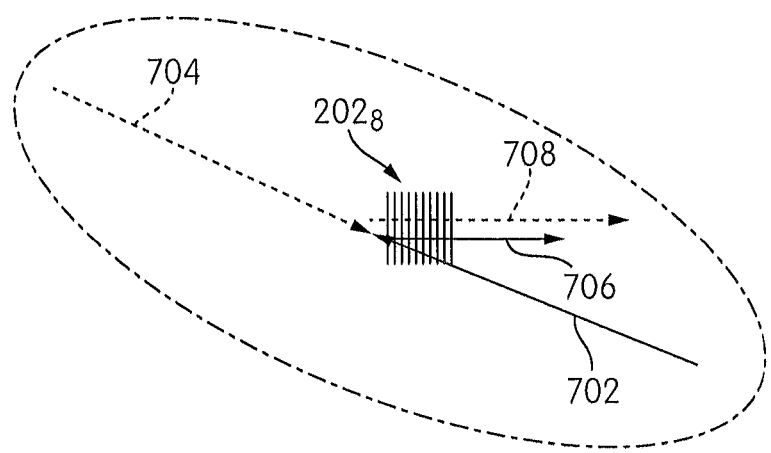

In an embodiment, the second "fly-in" movement and the second measurement are performed after the first "fly-in" movement and the first measurement of each of the targets. FIGS. 7A-7C provide schematic diagrams of a method 700 of measuring multiple targets using a measurement apparatus, in accordance with such an embodiment. The multiple targets $202_1 \ldots 202_x$ of FIG. 7A are provided in a group on, e.g., the substrate W2 (wherein "x" represents any number of targets, and is not limited to number in the illustrated embodiment). Again, for illustrative purposes only, the targets are noted as targets $202_1 \ldots 202_x$; however, this is not intended to limit the targets to the design as illustrated in FIG. 2.

The method 700 includes first performing a first "fly-in" motion and detection of the targets $202_1 \ldots 202_x$ for the group, as shown in FIG. 7A, then performing a second "fly-in" motion and detection of the targets $202_1 \ldots 202_x$, as shown in FIG. 7B. Specifically, FIG. 7A illustrates a first part of the detection for each target $202_1 \ldots 202_x$ in the group, wherein the a first "fly-in" motion (e.g., in a straight line) is made for each target and a first measurement is performed for each target—as schematically represented by 702—before the second "fly-in" motion and second measurement is made—as schematically represented by 704 in FIG. 7B. At 702, a first "fly-in" motion is performed (e.g., by moving the substrate table) in a "fly-in" direction (which may be in any direction) to a designated target, e.g., target $202_1$ in FIG. 7A, within the group of targets. Then a first measurement for that designated target $202_1$ is made using the measurement apparatus (after the "fly-in"). For example, each target may be scanned to perform the detection using the measurement spot, and the scanning of the target $202_1$ may be in any direction. In an embodiment, as illustrated in greater detail in FIG. 7C, in an embodiment, the relative movement of the measurement spot with respect to each target $202_1 \ldots 202_x$ is in a positive X-direction. Specifically, FIG. 7C shows the first "fly-in" direction as 702 to target $202_8$. Relative movement of the measurement spot with respect to the target $202_8$ is then performed in a positive X-direction (e.g., the target $202_8$ is scanned in the positive X-direction), as represented by arrow 706, to determine its first measurement.

Referring back to FIG. 7A, after both the first "fly-in" motion and detection of that target $202_1$ to determine the first measurement, there is a further first "fly-in" motion in any direction to a next target, e.g., $202_2$. A first measurement for the next target $202_2$ is then made (e.g., by scanning the target $202_2$ in, e.g., the same manner as shown in FIG. 7C, in a positive X-direction (706)). Thereafter, through a process of performing a first "fly-in" motion to each remaining target in the group and measuring each target, a first measurement is then successively performed for each target $202_3$, $202_4$, . . . $202_x$ in the group at 702 in FIG. 7A, until all of the first measurements are made.

After the first measurements for each target in the group is detected at 702, then a second "fly-in" motion and second measurement of each of the targets $202_1 \ldots 202_x$ is performed at 704 as shown in FIG. 7B (in a reverse or an opposite direction). More specifically, for each target $202_1 \ldots 202_x$ in the group, a second "fly-in" motion at an opposite direction to the respective direction of the first "fly-in" motion for the target is performed in a reverse order ($202_x \ldots 202_1$) for the group of target, along with a second measurement for each target at 704. For example, as shown in the detail of FIG. 7C for target $202_8$, the second "fly-in" motion is made in direction (704) opposite to the first "fly-in" motion direction (702) for target $202_x$ ($202_8$), and then a second measurement for that target $202_x$ ($202_8$) is detected, e.g., via scanning using relative movement between the measurement spot and the target (after the "fly-in" motion) in the same X-direction, as represented by arrow 708, after the first "fly-in" motion for target $202_x$ ($202_8$). The relative movement (e.g., scanning of each target $202_1 \ldots 202_x$), however, may be in any direction.

Referring back to FIG. 7B, after both the second "fly-in" motion and the second measurement of target $202_x$, a second "fly-in" motion in any direction is made for target $202_{14}$. A second measurement for the target $202_{14}$ is then made, e.g., by scanning the target $202_{14}$. Thereafter, through a process of second "fly-in" motions in a "fly-in" direction for each target, second measurements are then successively performed after each second "fly-in" motion for each target $202_{13}$, $202_{12}$ ... $202_1$ in the group at 704, until all of the second measurements are made.

Thereafter, the first and second measurements are combined (as described above in respect of FIG. 4) to determine a parameter of the patterning process. For example, in an embodiment, the parameter is determined for each target $202_1 \ldots 202_x$.

Figure 7D:
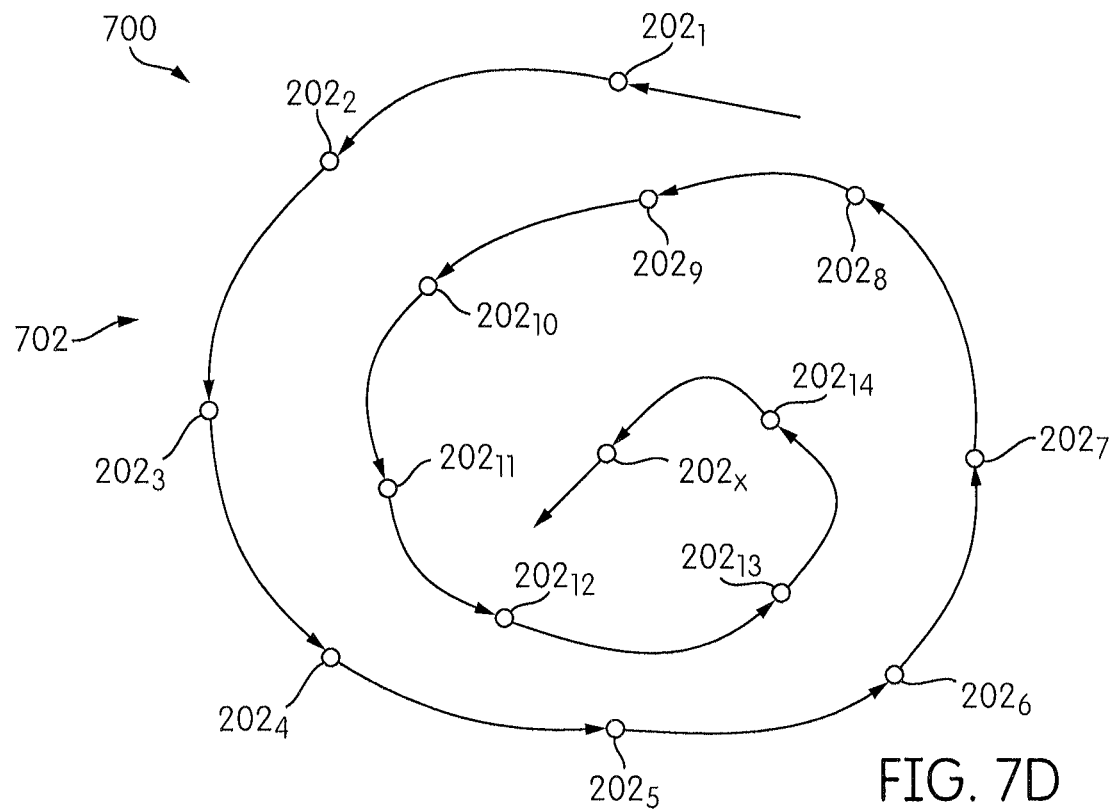
Figure 7E:
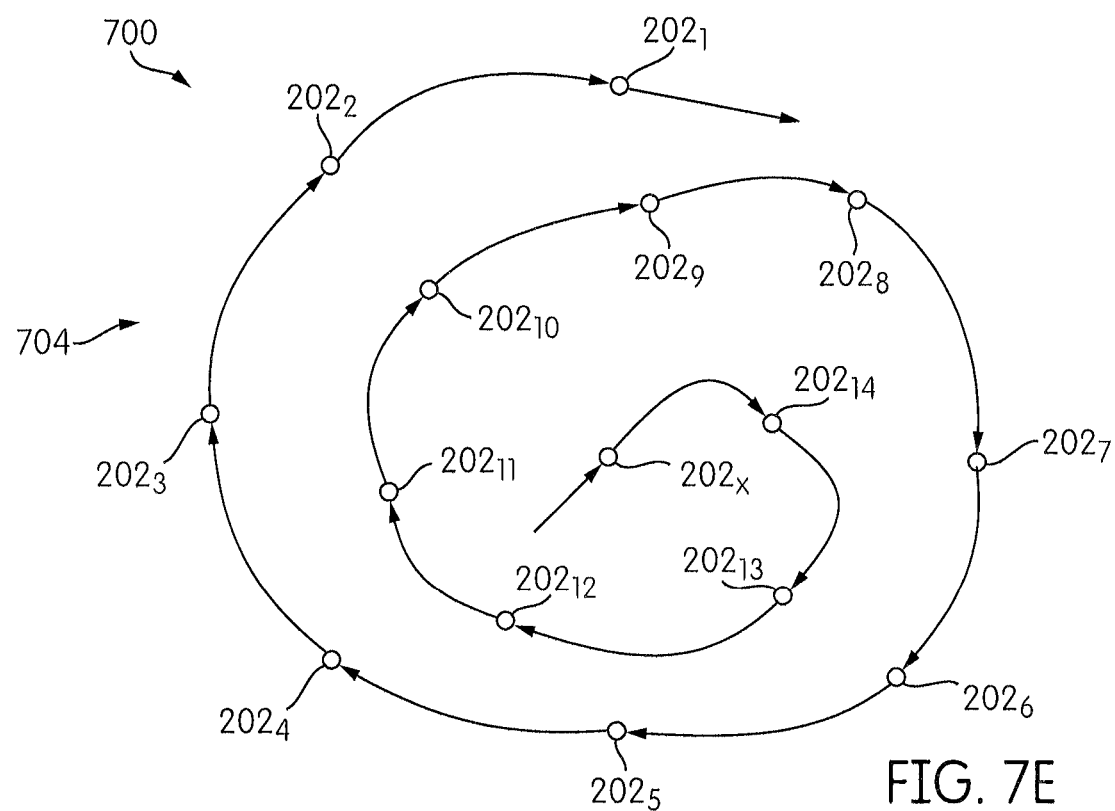

Although FIGS. 7A-7C generally illustrate "fly-in" paths that are in straight lines, it should be understood that this is not limiting. As shown in FIGS. 7D and 7E, for example, the "fly-in" path for one or more targets at 702 and 704 in the group may be curved and performed substantially fluidly. FIG. 7D illustrates a curved "fly-in" path for each target for a first measurement at 702, and FIG. 7E illustrates a curved "fly-in" path for each target, in a reverse order and direction, for a second measurement at 704. Of course, not all "fly-in" paths need be curved.

The "fly-in" direction and/or direction of relative movement of the measurement spot with respect to the target while the measurement spot is on the target or to cause the measurement spot to become located on the target is not limited. In an embodiment, the direction of relative movement of the measurement spot with respect to the target while the measurement spot is on the target or to cause the measurement spot to become located on the target for both measurements is in the same direction (e.g., see FIG. 5 and FIG. 7C). In an embodiment, the direction of relative movement of the measurement spot with respect to the target while the measurement spot is on the target or to cause the measurement spot to become located on the target in the first measurement is different than the direction of relative movement of the measurement spot with respect to the target while the measurement spot is on the target or to cause the measurement spot to become located on the target for the second measurement (e.g., the direction for the first measurement is in the positive X-direction while direction for the second measurement is in the negative X-direction).

In an embodiment, the relative movement of the measurement spot with respect to the target while the measurement spot is on the target or to cause the measurement spot to become located on the target for the first and second measurements of a target is in one direction, e.g., X-direction, while the "fly-in" directions for one or more of the targets may be different (e.g., from each other or from the scanning direction). For example, the "fly-in" direction may be at any direction, but the relative movement of the measurement spot with respect to the target while the measurement spot is on the target or to cause the measurement spot to become located on the target is in the X-direction.

In accordance with an embodiment, the "fly-in" direction is different than the direction of relative movement of the measurement spot with respect to the target while the measurement spot is on the target or to cause the measurement spot to become located on the target in both measurements, but the relative movement of the measurement spot with respect to the target while the measurement spot is on the target or to cause the measurement spot to become located on the target in both measurements are performed in the same direction (see, e.g., FIG. 5).

In an embodiment, the relative movement of the measurement spot with respect to the target while the measurement spot is on the target or to cause the measurement spot to become located on the target for both measurements is in any direction, while the "fly-in" directions are the same (e.g., at a non-zero angle) as described earlier.

In an embodiment, the first "fly-in" direction is provided at an obtuse angle relative to a direction of relative movement of the measurement spot with respect to the target while the measurement spot is on the target or to cause the measurement spot to become located on the target, and the second "fly-in" direction in the opposite direction is provided at an acute angle relative to the direction of relative movement of the measurement spot with respect to the target while the measurement spot is on the target or to cause the measurement spot to become located on the target. In an embodiment, the first "fly-in" direction is provided at an acute angle relative to the direction of relative movement of the measurement spot with respect to the target while the measurement spot is on the target or to cause the measurement spot to become located on the target, and the second "fly-in" direction in the opposite direction is provided at an acute angle relative to the direction of relative movement of the measurement spot with respect to the target while the measurement spot is on the target or to cause the measurement spot to become located on the target.

Further, for a group of targets that is measured in the exemplary manner as described with reference to FIG. 7A-7E, the "fly-in" direction for each of the targets may be the same, according to an embodiment. In an embodiment, the "fly-in" direction for each of the targets in the group is different. In accordance with an embodiment, the relative movement of the measurement spot with respect to the target while the measurement spot is on the target or to cause the measurement spot to become located on the target for each target in the group of targets is in the same direction. In an embodiment, the direction of relative movement of the measurement spot with respect to the target while the measurement spot is on the target or to cause the measurement spot to become located on the target for each target in the group is in a different direction.

In accordance with an embodiment, the relative movement of the measurement spot with respect to the target while the measurement spot is on the target or to cause the measurement spot to become located on the target for each target in the group of targets is in the same direction, but the first "fly-in" direction (and thus the second mirrored or opposite "fly-in" direction) is different than the direction of relative movement of the measurement spot with respect to the target while the measurement spot is on the target or to cause the measurement spot to become located on the target.

Also, although not specifically illustrated in FIGS. 7A-7E, a termination point for each target may be established for one or more of the targets in the group of targets. Furthermore, it should be noted that the "fly-in" movement for a target—either in a group or alone—does not necessarily need to be at or before a target. That is, the relative movement may be designed to "overshoot" a target (e.g., the measurement spot "overshoots" the target) such that a relative movement of the measurement spot with respect to the target while the measurement spot is on the target or to cause the measurement spot to become located on the target can be made in an opposite direction. For example, each target may be overshot to a point, and then a relative movement of the measurement spot with respect to the target while the measurement spot is on the target or to cause the measurement spot to become located on the target can be made in an opposite direction.

It should be noted that the positioning of the targets $202_1$, $202_2$, ... $202_x$ in FIGS. 7A-7B and/or 7C-7D is not intended to be limiting. The targets $202_1$, $202_2$, ... $202_x$ are shown in this configuration simply for explanatory purposes. Further, the arrows in FIGS. 7A-7B and/or 7C-7D for the targets $202_1$, $202_2$, ... $202_x$ are schematic only, designed to represent an example of various "fly-in", etc. directions. However, it should be understood that the "fly-in", etc. directions of each target in 702 and 704 is not limited to linear or successive adjacent movement as generally depicted by the arrows in FIGS. 7A-7B and/or 7C-7D. Rather, for example, the successive "fly-in", etc. of each of the targets $202_1$, $202_2$, ... $202_x$ in the first measurement at 702 may be in any order. The second "fly-in", etc. of the targets $202_1$, $202_2$, ... $202_x$ in the second measurement at 704, however, would be in the reverse order of the first measurements at 702, with the second "fly-in" for each target being in an opposite direction to the direction of the first "fly-in" for that same target. As illustrated by the arrows in FIG. 7A, for example, in an embodiment, the first measurements at 702 are performed in a counter-clockwise direction, and the second measurements at 704 are performed in a clockwise direction in FIG. 7B. The relative movement of the measurement spot with respect to the target while the measurement spot is on the target or to cause the measurement spot to become located on the target for the targets at 702 or 704 may be in the same direction or in different directions.

Also the labeling of the targets as $202_1$, $202_2$, ... $202_x$ and the description related to these targets is not intended to limit the order in which the targets are processed by the measurement apparatus.

Reference to the second "fly-in" at or in an opposite direction as disclosed herein refers to a reverse direction that is along a line of movement within the same plane. In an embodiment, it is 180 degrees to the first "fly-in" direction. For simplicity purposes, throughout this disclosure the second "fly-in" direction is referred to as flying in at an "opposite direction", but it should be understood that reference to an "opposite" direction throughout this disclosure includes a substantially, essentially, or nearly opposite direction to the first "fly-in" direction. For example, in an embodiment, flying in at an essentially opposite direction refers to a relative movement that is at an angle between approximately 175 degrees to approximately 185 degrees (both inclusive) relative to the direction of the first "fly-in". In an embodiment, the opposite direction is between approximately 178 degrees to approximately 182 degrees (both inclusive) relative to the first "fly-in" direction.

In an embodiment, flying in at an (essentially) opposite direction may refer to movement of the stage. For example, as shown in FIG. 5 at 506 and in FIG. 6 at 606, the stage may be moved, after a first scan, to a point or distance such that it can "fly-in" in the opposite direction. In an embodiment, the movement of the stage may refer to rotation of the stage by 180 degrees. However, rotation of the stage is not necessary. As previously noted, in the method 700 explained with reference to FIGS. 7A-7E, in addition to the opposite "fly-in" directions, the "fly-in" directions and/or direction of the relative movement of the measurement spot with respect to the target while the measurement spot is on the target or to cause the measurement spot to become located on the target also refer to counterclockwise and clockwise directions. This mirrored or opposite "fly-in" direction reverses an error in measurements, and, accordingly, measured errors can cancel each other out, thereby leaving a more accurate measurement for the target.

Further, although, in embodiments, movement towards the same termination point 512 is described with reference to both (opposite) "fly-in" directions, it should be noted that, in accordance with an embodiment, two different termination points may be used in any of the previously described methods. That is, the first "fly-in" direction may be to a first termination point, and the second "fly-in" direction in the opposite direction may be to a second termination point that is different than the first termination point. In an embodiment, the first termination point is provided at one side of a target and the second termination is provided at another (e.g., opposite) side of the target. Accordingly, the relative movement of the measurement spot with respect to the target while the measurement spot is on the target or to cause the measurement spot to become located on the target may be in opposite directions, e.g., from the first termination point the target may be scanned in a first direction (e.g., positive (+) X-direction) during measurement, and from the second termination point the target may be scanned in a direction opposite to the first direction (e.g., negative (−) X-direction) during measurement.

Moreover, it is again noted that the detection or measurements taken of the target(s) as described herein may include any number of methods and devices, including, but not limited to scanning (with a scanner) or capturing an image (e.g., using a camera, or recording an image) of a target.

Additionally, it has been described throughout this disclosure that detection of the first and second measurements for the target may be performed by moving the target (e.g., in first or second directions). However, the detection and/or scanning of the target(s) may be performed without moving the target, in accordance with an embodiment. For example, in an embodiment, to scan a target with the measurement apparatus, a component of the measurement apparatus itself and/or the measuring beam of the measurement beam may move for target detection, while the target remains substantially static.

In any of the above described embodiments, after the second measurement is obtained, then, in accordance with an embodiment, a parameter of the patterning process (e.g., position of the target(s)) may be determined (e.g, using processing unit PU) by averaging the detected first and second measurements. Based on this average, then, the PU and/or LACU may cause an action in the patterning process (e.g., move or align the substrate table for imaging).

Utilizing the disclosed methods, the measurement apparatus can provide higher accuracy of exposure of, for example, the substrate W2. An average of measurements done with opposite fly in directions helps cancel out measurement error. The accuracy of the measurements may be improved from 2 to 4 times in the X direction and/or in the Y direction as compared to results of prior methods utilizing only a single measurement (one X measurement, one Y measurement) of a target. Further, the measurement process may be performed at a faster speed, since the target may be moved at a faster speed, thereby resulting in faster measurements and thus higher machine throughput (e.g., higher substrate throughput).

In an embodiment, there is provided a method of measuring a target, the method comprising: performing a first relative movement in a first direction between the target and a measurement spot of a measurement apparatus; after the first relative movement, performing a second relative movement in a second direction between the measurement spot and the target at least partially while the measurement spot is on the target or to cause the measurement spot to become located on the target; during or after the second relative movement, performing a first measurement for the target using the measurement spot on the target; after the first measurement, performing a third relative movement in an essentially opposite direction to the first direction between the target and the measurement spot; after the third relative movement, performing a fourth relative movement in the second direction between the measurement spot and the target at least partially while the measurement spot is on the target or to cause the measurement spot to become located on the target; and during or after the fourth relative movement, performing a second measurement for the target using the measurement spot on the target.

In an embodiment, there is provided a method of measuring a target, the method comprising: performing a first relative movement between the target and a measurement spot of a measurement apparatus in a first direction and to a termination point; after the first relative movement, performing a second relative movement in a second direction between the measurement spot and the target at least partially while the measurement spot is on the target or to cause the measurement spot to become located on the target; during or after the second relative movement, performing a first measurement for the target using the measurement spot on the target; after the first measurement, performing a third relative movement between the target and the measurement spot in an essentially opposite direction to the first direction and to the termination point; after the third relative movement, performing a fourth relative movement in a third direction between the measurement spot and the target at least partially while the measurement spot is on the target or to cause the measurement spot to become located on the target; and during or after the fourth relative movement, performing a second measurement for the target using the measurement spot on the target.

In an embodiment, there is provided a method of measuring a target, the method comprising: performing a first relative movement at a non-zero angle to a first direction or a second direction, between the target and a measurement spot of a measurement apparatus; after the first relative movement, performing relative movement in the first direction between the measurement spot and the target at least partially while the measurement spot is on the target or to cause the measurement spot to become located on the target; during or after the first relative movement, performing a first measurement for the target using the measurement spot on the target; after the first measurement, performing a third relative movement at an angle essentially opposite to the non-zero angle between the target and the measurement spot; after the third relative movement, performing a fourth relative movement in the second direction between the measurement spot and the target at least partially while the measurement spot is on the target or to cause the measurement spot to become located on the target; and during or after the fourth relative movement, performing a second measurement for the target using the measurement spot on the target.

In an embodiment, the methods further comprise averaging the first and second measurements, and wherein a parameter of the target or a patterning process is determined by the average. In an embodiment, the performing the first measurement and/or the second measurement comprises scanning the target using the measurement spot. In an embodiment, a distance for the first relative movement is the same as a distance for the third relative movement. In an embodiment, a distance for the first relative movement is different than a distance for the third relative movement. In an embodiment, the second and third directions are the same direction. In an embodiment, a plurality of targets are provided, and wherein the methods comprise performing each of the first, second, third and fourth relative movements for each target of the plurality of targets before performing each of the first, second, third and fourth relative movements for a next target. In an embodiment, a plurality of targets are provided, and wherein the methods comprise performing the first and second relative movements for each target of the plurality of targets and after completion of the first and second relative movements for each target of the plurality of targets, performing the third and fourth relative movements for each target of the plurality of targets. In an embodiment, the methods further comprise averaging the first and second measurements for each target individually. In an embodiment, the target comprises an alignment mark and the measurement comprises a position measurement. In an embodiment, the first, second, third or fourth relative movement comprises moving the target relative to a substantially stationary measurement spot.

In an embodiment, there is provided an apparatus comprising: a substrate table; a measurement system configured to measure a target on the substrate table using a beam, the beam being directed towards a spot on the substrate table; and a control system configured to control the position of the substrate table relative to the measurement system, the control system configured to: move the substrate table to cause a first relative movement in a first direction between the target and the spot, after the first relative movement, perform a second relative movement in a second direction between the spot and the target at least partially while the spot is on the target or to cause the spot to become located on the target, during or after the second relative movement, perform a first measurement for the target using the spot on the target, after the first measurement, move the substrate table to perform a third relative movement in an essentially opposite direction to the first direction between the target and the spot, after the third relative movement, perform a fourth relative movement in the second direction between the spot and the target at least partially while the spot is on the target or to cause the spot to become located onto the target, and during or after the fourth relative movement, perform a second measurement for the target using the spot on the target.

In an embodiment, there is provided an apparatus comprising: a substrate table; a measurement system configured to measure a position of the target on the substrate table using a beam, the beam being directed towards a spot on the substrate table; and a control system configured to control the relative position between the substrate table and the beam, the control system configured to: move the substrate table to cause a first relative movement between the target and the spot in a first direction and to a termination point, after the first relative movement, perform a second relative movement in a second direction between the spot and the target at least partially while the spot is on the target or to cause the spot to become located on the target, during or after the second relative movement, perform a first measurement for the target using the spot on the target, after the first measurement, move the substrate table to cause a third relative movement between the target and the spot in an essentially opposite direction to the first direction and to the termination point, after the third relative movement, perform a fourth relative movement in a third direction between the spot and the target at least partially while the spot is on the target or to cause the spot to become located on the target, and during or after the fourth relative movement, perform a second measurement for the target using the spot on the target.

In an embodiment, there is provided an apparatus comprising: a substrate table; a measurement system configured to measure a target on the substrate table using a beam, the beam being directed towards a spot on the substrate table; and a control system configured to control the position of the substrate table relative to the beam, the control system configured to: move the substrate table to cause a first relative movement at a non-zero angle to a first direction or a second direction, between the target and the spot, after the first relative movement, perform relative movement in the first direction between the spot and the target at least partially while the spot is on the target or to cause the spot to become located on the target, during or after the first relative movement, perform a first measurement for the target using the spot on the target, after the first measurement, move the substrate table to cause a third relative movement at an angle essentially opposite to the non-zero angle between the target and the spot, after the third relative movement, perform a fourth relative movement in the second direction between the spot and the target at least partially while the spot is on the target or to cause the spot to become located on the target, and during or after the fourth relative movement, perform a second measurement for the target using the spot on the target.

In addition, the disclosed methods may be implemented and applied to existing machines without hardware modification. For example, the disclosed methods may be implemented as instructions stored on a machine-readable medium, which may be read and executed by one or more processors (e.g., LACU and/or PU). A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions, including those of method 400 and the additional disclosed embodiments herein as shown in FIGS. 4-7E. However, it should be appreciated that such descriptions are merely for convenience and that such actions in fact result from computing devices, processors, controllers, or other devices executing the firmware, software, routines, instructions, etc.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The lithographic apparatus may also be of a type wherein a surface of the substrate is immersed in a liquid having a relatively high refractive index, e.g. water, so as to fill a space between a final element of the projection system and the substrate. Immersion liquids may also be applied to other spaces in the lithographic apparatus, for example, between the patterning device and a first element of the projection system. Immersion techniques are well known in the art for increasing the numerical aperture of projection systems.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments have been described above, it will be appreciated that the invention may be practiced otherwise than as described. For example, an embodiment of the invention may take the form of a computer program containing one or more sequences of machine-readable instructions configured to cause performance of a method as disclosed herein, or a computer-readable data storage medium (e.g. semiconductor memory, magnetic or optical disk) having such a computer program stored therein.

The descriptions above are intended to be illustrative, not limiting. Thus, it will be apparent to those skilled in the art that modifications may be made to the invention as described without departing from the scope of the claims set out below.

What is claimed is:

1. A method of measuring a target comprising a plurality of structures, the method comprising:
performing a first relative movement in a first direction between the target formed on a substrate and a measurement spot of a measurement apparatus;
after the first relative movement, performing a second relative movement in a second direction between the measurement spot and the target at least partially while the measurement spot is at least partially on at least one of the structures of the target or to cause the measurement spot to become at least partially located on at least one of the structures of the target at the end of the second relative movement;
during or after the second relative movement, performing a first measurement of the plurality of structures of the target using the measurement spot on the target;
after the first measurement, performing a third relative movement in an essentially opposite direction to the first direction between the target and the measurement spot;
after the third relative movement, performing a fourth relative movement in the second direction between the measurement spot and the target at least partially while the measurement spot is at least partially on at least one of the structures of the target or to cause the measurement spot to become at least partially located on at least one of the structures of the target at the end of the fourth relative movement; and during or after the fourth relative movement, performing a second measurement of the plurality of structures of the target using the measurement spot on the target, the second measurement measuring at least the same plurality of structures of the target as the first measurement.

2. A method of measuring a target comprising a plurality of structures, the method comprising:

performing a first relative movement between the target formed on a substrate and a measurement spot of a measurement apparatus in a first direction and to a termination point within an area on the substrate where the area of the measurement spot is incident on the substrate at the end of the first relative movement;

after the first relative movement, performing a second relative movement in a second direction between the measurement spot and the target at least partially while the measurement spot is on the target or to cause the measurement spot to become located on the target;

during or after the second relative movement, performing a first measurement of the plurality of structures of the target using the measurement spot on the target;

after the first measurement, performing a third relative movement between the target and the measurement spot in an essentially opposite direction to the first direction and to a termination point within the area on the substrate where the area of the measurement spot is incident on the substrate at the end of the first relative movement;

after the third relative movement, performing a fourth relative movement in a third direction between the measurement spot and the target at least partially while the measurement spot is on the target or to cause the measurement spot to become located on the target; and during or after the fourth relative movement, performing a second measurement of the plurality of structures of the target using the measurement spot on the target, the second measurement measuring at least the same plurality of structures of the target as the first measurement.

3. A method of measuring a target comprising a plurality of structures, the method comprising:

performing a first relative movement at an oblique angle to a first direction or a second direction, between the target formed on a substrate and a measurement spot of a measurement apparatus;

after the first relative movement, performing relative movement in the first direction between the measurement spot and the target at least partially while the measurement spot is on the target or to cause the measurement spot to become located on the target;

during or after the first relative movement, performing a first measurement of the plurality of structures of the target using the measurement spot on the target;

after the first measurement, performing a third relative movement at an angle essentially opposite to the oblique angle between the target and the measurement spot;

after the third relative movement, performing a fourth relative movement in the second direction between the measurement spot and the target at least partially while the measurement spot is on the target or to cause the measurement spot to become located on the target; and during or after the fourth relative movement, performing a second measurement of the plurality of structures of the target using the measurement spot on the target, the second measurement measuring at least the same plurality of structures of the target as the first measurement.

4. The method according to claim 1, further comprising averaging the first and second measurements, and wherein a parameter of the target or a patterning process is determined by the average.

5. The method according to claim 1, wherein the performing the first measurement and/or the second measurement comprises scanning the target using the measurement spot.

6. The method according to claim 1, wherein a distance for the first relative movement is the same as a distance for the third relative movement.

7. The method according to claim 1, wherein a distance for the first relative movement is different than a distance for the third relative movement.

8. The method according to claim 2, wherein the second and third directions are the same direction.

9. The method according to claim 1, wherein a plurality of targets is provided, and wherein the method comprises performing each of the first, second, third and fourth relative movements for each target of the plurality of targets before performing each of the first, second, third and fourth relative movements for a next target.

10. The method according to claim 1, wherein a plurality of targets is provided, and wherein the method comprises performing the first and second relative movements for each target of the plurality of targets and after completion of the first and second relative movements for each target of the plurality of targets, performing the third and fourth relative movements for each target of the plurality of targets.

11. The method according to claim 9, further comprising averaging the first and second measurements for each target individually.

12. The method according to claim 1, wherein the target comprises an alignment mark and the measurement comprises a position measurement.

13. The method according to claim 1, wherein the first, second, third or fourth relative movement comprises moving the target relative to a substantially stationary measurement spot.

14. A non-transitory computer-readable medium comprising instructions therein, the instructions, upon execution by a computer system, configured to cause the computer system to cause at least:

performance of a first relative movement in a first direction between a target, formed on a substrate, comprising a plurality of structures and a measurement spot of a measurement apparatus;

after the first relative movement, performance of a second relative movement in a second direction between the measurement spot and the target at least partially while the measurement spot is at least partially on at least one of the structures of the target or to cause the measurement spot to become at least partially located on at least one of the structures of the target at the end of the second relative movement;

during or after the second relative movement, performance of a first measurement of the plurality of structures of the target using the measurement spot on the target;

after the first measurement, performance of a third relative movement in an essentially opposite direction to the first direction between the target and the measurement spot;

after the third relative movement, performance of a fourth relative movement in the second direction between the measurement spot and the target at least partially while the measurement spot is at least partially on at least one of the structures of the target or to cause the measurement spot to become at least partially located on at least one of the structures of the target at the end of the fourth relative movement; and during or after the fourth relative movement, performance of a second measurement of the plurality of structures of the target using the measurement spot on the target, the second measurement measuring at least the same plurality of structures of the target as the first measurement.

15. A non-transitory computer-readable medium comprising instructions therein, the instructions, upon execution by a computer system, configured to cause the computer system to cause at least:

performance of a first relative movement between a target, formed on a substrate, comprising a plurality of structures and a measurement spot of a measurement apparatus in a first direction and to a termination point within an area on the substrate where the area of the measurement spot is incident on the substrate at the end of the first relative movement;

after the first relative movement, performance of a second relative movement in a second direction between the measurement spot and the target at least partially while the measurement spot is on the target or to cause the measurement spot to become located on the target;

during or after the second relative movement, performance of a first measurement of the plurality of structures of the target using the measurement spot on the target;

after the first measurement, performance of a third relative movement between the target and the measurement spot in an essentially opposite direction to the first direction and to a termination point within the area on the substrate where the area of the measurement spot is incident on the substrate at the end of the first relative movement;

after the third relative movement, performance of a fourth relative movement in a third direction between the measurement spot and the target at least partially while the measurement spot is on the target or to cause the measurement spot to become located on the target; and during or after the fourth relative movement, performance of a second measurement of the plurality of structures of the target using the measurement spot on the target, the second measurement measuring at least the same plurality of structures of the target as the first measurement.

16. The method according to claim 2, further comprising averaging the first and second measurements, and wherein a parameter of the target or a patterning process is determined by the average.

17. The method according to claim 2, wherein the performing the first measurement and/or the second measurement comprises scanning the target using the measurement spot.

18. A non-transitory computer-readable medium comprising instructions therein, the instructions, upon execution by a computer system, configured to cause the computer system to cause at least:

performance of a first relative movement at an oblique angle to a first direction or a second direction, between a target, formed on a substrate, comprising a plurality of structures and a measurement spot of a measurement apparatus;

after the first relative movement, performance of a relative movement in the first direction between the measurement spot and the target at least partially while the measurement spot is on the target or to cause the measurement spot to become located on the target;

during or after the first relative movement, performance of a first measurement of the plurality of structures of the target using the measurement spot on the target;

after the first measurement, performance of a third relative movement at an angle essentially opposite to the oblique angle between the target and the measurement spot;

after the third relative movement, performance of a fourth relative movement in the second direction between the measurement spot and the target at least partially while the measurement spot is on the target or to cause the measurement spot to become located on the target; and during or after the fourth relative movement, performance of a second measurement of the plurality of structures of the target using the measurement spot on the target, the second measurement measuring at least the same plurality of structures of the target as the first measurement.

19. The method according to claim 3, further comprising averaging the first and second measurements, and wherein a parameter of the target or a patterning process is determined by the average.

20. The method according to claim 3, wherein the performing the first measurement and/or the second measurement comprises scanning the target using the measurement spot.

* * * * *